United States Patent
De Santis et al.

(10) Patent No.: US 10,528,292 B2
(45) Date of Patent: Jan. 7, 2020

(54) POWER DOWN/POWER-LOSS MEMORY CONTROLLER

(71) Applicants: Luca De Santis, Avezzano (IT); Tommaso Vali, Sezze (IT); Luca Nubile, Turrivalignani (IT); Ricardo Cardinali, Teramo (IT); Maria L. Gallese, Avezzano (IT); Cristina Lattaro, Rieti (IT)

(72) Inventors: Luca De Santis, Avezzano (IT); Tommaso Vali, Sezze (IT); Luca Nubile, Turrivalignani (IT); Ricardo Cardinali, Teramo (IT); Maria L. Gallese, Avezzano (IT); Cristina Lattaro, Rieti (IT)

(*) Notice: Subject to any disclaimer, the term of this patent is extended or adjusted under 35 U.S.C. 154(b) by 0 days.

(21) Appl. No.: 15/986,804

(22) Filed: May 22, 2018

(65) Prior Publication Data
US 2019/0042156 A1 Feb. 7, 2019

(51) Int. Cl.
*G11C 16/04* (2006.01)
*G06F 3/06* (2006.01)
*G06F 1/26* (2006.01)

(52) U.S. Cl.
CPC ........... *G06F 3/0659* (2013.01); *G06F 1/26* (2013.01); *G06F 3/0604* (2013.01); *G06F 3/0619* (2013.01); *G06F 3/0634* (2013.01); *G06F 3/0653* (2013.01); *G06F 3/0679* (2013.01); *G11C 16/0483* (2013.01)

(58) Field of Classification Search
CPC .................................. G11C 5/147; G11C 8/18
USPC ............................................... 365/226, 233.1
See application file for complete search history.

(56) References Cited

U.S. PATENT DOCUMENTS 5,566,121 A * 10/1996 Hadderman .......... G11C 11/406
                                                   365/189.2
6,138,195 A * 10/2000 Bermingham ...... G06F 13/4068
                                                     365/26

(Continued)

FOREIGN PATENT DOCUMENTS

JP          2016218973 A       12/2016

OTHER PUBLICATIONS

Extended European Search Report dated Oct. 14, 2019 for EP Application No. 19172568.8, 9 pages.

*Primary Examiner* — Michael T Tran
(74) *Attorney, Agent, or Firm* — Schwabe, Williamson & Wyatt, P.C.

(57) ABSTRACT

Embodiments of the present disclosure may relate to a memory controller that may include a main controller to begin a power down of a non-volatile memory storage during a first time period, while operating in a first voltage range, wherein the main controller is to begin the power down of the non-volatile memory in response to an indication of a voltage level being below a predetermined threshold; and a sequencer to continue the power down of the memory storage during a second time period, while operating within a second voltage range lower than the first voltage range. In some embodiments, the sequencer may include a state machine to perform a discharge sequence, where the state machine includes a micro-action output to output a micro-action command to the memory storage based at least in part on a current state of the state machine. Other embodiments may be described and/or claimed.

22 Claims, 7 Drawing Sheets

(56) References Cited

U.S. PATENT DOCUMENTS

| | | | |
|---|---|---|---|
| 8,378,530 B1* | 2/2013 | Morales | H05K 7/1492 307/147 |
| 9,613,676 B1* | 4/2017 | Wang | G11C 11/2275 |
| 10,236,053 B1* | 3/2019 | Ramaraju | G11C 7/065 |
| 2002/0167350 A1* | 11/2002 | Sato | G05F 1/46 327/540 |
| 2003/0057931 A1* | 3/2003 | Di Iorio | G11C 5/147 323/313 |
| 2004/0027888 A1* | 2/2004 | Kurita | G11C 11/406 365/202 |
| 2004/0066217 A1* | 4/2004 | Daniels | H03K 17/302 327/99 |
| 2004/0160793 A1* | 8/2004 | Miermans | H02M 1/36 363/65 |
| 2005/0094474 A1* | 5/2005 | Deng | G11C 5/14 365/229 |
| 2006/0023512 A1* | 2/2006 | Maejima | G11C 16/0483 365/185.22 |
| 2006/0256640 A1* | 11/2006 | Hardy | G11C 5/14 365/226 |
| 2007/0041257 A1* | 2/2007 | Kim | G11C 7/08 365/207 |
| 2007/0188194 A1* | 8/2007 | Yang | H03K 19/018528 326/80 |
| 2008/0055964 A1* | 3/2008 | Kang | G11C 13/0004 365/148 |
| 2008/0159016 A1* | 7/2008 | Han | G11C 5/147 365/189.09 |
| 2009/0034352 A1 | 2/2009 | Choy et al. | |
| 2010/0034043 A1* | 2/2010 | Kim | G11C 5/14 365/226 |
| 2010/0074014 A1* | 3/2010 | Dunga | G11C 7/04 365/185.17 |
| 2010/0080033 A1* | 4/2010 | Xu | G11C 11/4125 365/72 |
| 2010/0182867 A1* | 7/2010 | Lee | G11C 5/145 365/226 |
| 2010/0214836 A1* | 8/2010 | Honda | G11C 5/145 365/185.2 |
| 2011/0188314 A1* | 8/2011 | Kuo | G11C 5/14 365/185.18 |
| 2011/0208410 A1* | 8/2011 | Izumoto | B60W 10/06 701/112 |
| 2012/0086402 A1* | 4/2012 | Carder | H02J 1/108 320/118 |
| 2012/0327749 A1* | 12/2012 | Tsukamoto | G06F 1/14 368/204 |
| 2013/0003462 A1* | 1/2013 | Castagna | G11C 5/14 365/185.23 |
| 2013/0021853 A1* | 1/2013 | Yoo | G11C 16/06 365/189.05 |
| 2013/0036270 A1* | 2/2013 | Dreslinski | G06F 12/0893 711/128 |
| 2013/0336080 A1* | 12/2013 | Frans | G11C 7/222 365/226 |
| 2014/0064010 A1* | 3/2014 | Barkley | G11C 5/14 365/226 |
| 2014/0219040 A1* | 8/2014 | Hwang | G11C 5/148 365/194 |
| 2014/0281625 A1* | 9/2014 | Younger | G06F 1/3206 713/323 |
| 2015/0130533 A1 | 5/2015 | Jeon et al. | |
| 2015/0145600 A1* | 5/2015 | Hur | H03F 3/211 330/295 |
| 2015/0170716 A1* | 6/2015 | Lucas | G11C 5/147 365/226 |
| 2015/0198986 A1* | 7/2015 | Chang | G06F 1/26 713/330 |
| 2015/0235677 A1* | 8/2015 | Grunzke | G11C 5/14 365/226 |
| 2015/0253840 A1* | 9/2015 | Hong | G06F 1/3265 345/690 |
| 2015/0302913 A1* | 10/2015 | Song | G11C 11/406 365/222 |
| 2016/0110127 A1 | 4/2016 | Qiao et al. | |
| 2016/0127875 A1* | 5/2016 | Zampini, II | H04W 4/043 370/311 |
| 2016/0187431 A1* | 6/2016 | Yamamoto | H01M 10/441 324/426 |
| 2016/0203870 A1* | 7/2016 | Moon | G11C 16/26 365/185.11 |
| 2016/0372176 A1* | 12/2016 | Song | G11C 7/08 |
| 2017/0011780 A1* | 1/2017 | Kim | G11C 5/148 |
| 2017/0019018 A1* | 1/2017 | Kim | H02M 1/36 |
| 2017/0032845 A1* | 2/2017 | Zhang | G11C 16/30 |
| 2017/0069392 A1* | 3/2017 | Tanzawa | G11C 16/26 |
| 2017/0075408 A1* | 3/2017 | Banerjee | G06F 1/3287 |
| 2017/0077912 A1* | 3/2017 | Fu | G05F 1/00 |
| 2017/0141714 A1* | 5/2017 | Looby | H02P 6/12 |
| 2017/0177057 A1* | 6/2017 | Morning-Smith | G06F 1/3206 |
| 2017/0249005 A1* | 8/2017 | Hwang | G06F 1/3218 |
| 2017/0310156 A1* | 10/2017 | Dvoskin | G11C 5/145 |
| 2018/0101415 A1* | 4/2018 | Mahindru | G06F 9/5094 |
| 2018/0166111 A1* | 6/2018 | Yu | G11C 7/227 |
| 2018/0188797 A1* | 7/2018 | Wang | G06F 1/3287 |
| 2018/0292851 A1* | 10/2018 | Mahajan | G05F 1/575 |
| 2018/0323624 A1* | 11/2018 | Chang | H02J 7/0068 |
| 2019/0005995 A1* | 1/2019 | Oh | G11C 8/08 |
| 2019/0035466 A1* | 1/2019 | Kim | G11C 16/0483 |

* cited by examiner

POWER DOWN/POWER-LOSS MEMORY CONTROLLER

FIELD

Embodiments of the present disclosure generally relate to the field of computer data storage devices and, more particularly, to devices and techniques for voltage discharge after a power-down or power-loss event.

BACKGROUND

Voltage around circuits of some types of non-volatile memory devices such as NAND flash memory is discharged in a particular sequence following a power-down or power-loss event to increase circuit reliability and avoid data corruption. Typically, NAND device controllers function in a voltage range with a lower limit that results in a corresponding limit to the time period available to manage discharge operations during a power-down or power-loss event.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure may relate to a memory controller for a non-volatile memory that may include a main controller to begin a power down of a memory device during a first time period, while operating in a first voltage range. In some embodiments, the main controller may begin the power down of the memory device in response to an indicator from a voltage level detector that indicates a voltage level of the memory device is below a predetermined threshold. In various embodiments, a sequencer may continue the power down of the memory device during a second time period, while operating within a second voltage range lower than the first voltage range. In some embodiments, the memory controller may include the voltage level detector in an analog circuit. In some embodiments, the main controller may direct the sequencer to continue the power down of the memory device. In some embodiments, the sequencer may include a state machine to perform a discharge sequence, where the state machine may include a micro-action output to output a micro-action command to the memory device based at least in part on a current state of the state machine. In some embodiments, the memory controller may include a multiplexer having a first input coupled with the main controller, a second input coupled with the sequencer, and an output coupled with a control bus of the memory device. In various embodiments, the multiplexer may selectively couple the main controller or the sequencer to the control bus in response to a select signal.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. It will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

Figure 1:
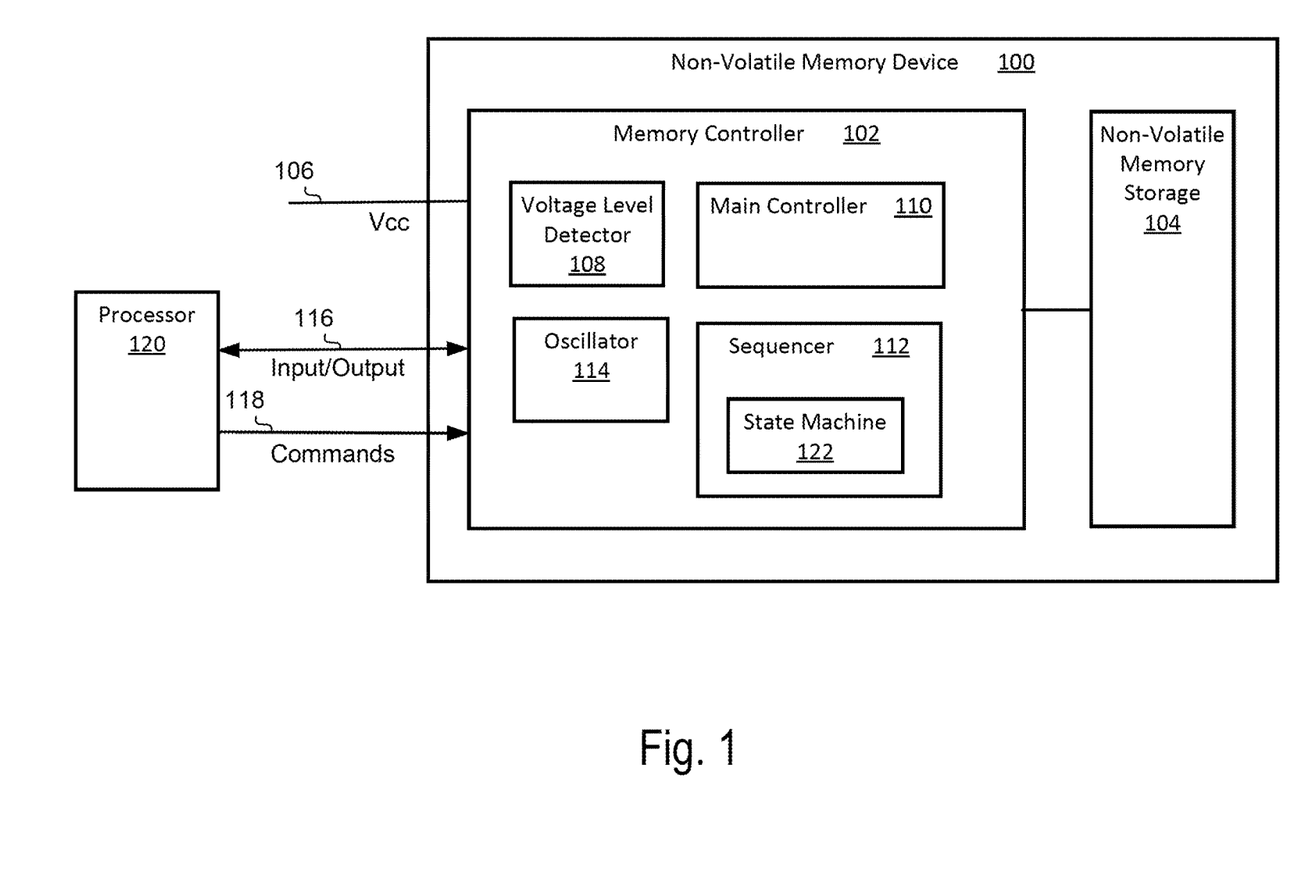
FIG. 1 depicts a block diagram of a non-volatile memory (NVM) device including power-loss/power-down voltage discharge capability, in accordance with various embodiments.

FIG. 1 depicts a block diagram of a non-volatile memory (NVM) device 100 that may include a memory controller 102 with a power-loss/power-down voltage discharge capability, in accordance with various embodiments. In some embodiments, the NVM device 100 may include a NVM storage 104 coupled with the memory controller 102. In various embodiments, the NVM storage may be NAND memory, or any other type of suitable NVM storage. In some embodiments, the NVM device 100 may include one or more power terminals such as a Vcc terminal 106 to power one or more components of the NVM device 100, including the NVM storage 104. In various embodiments, the Vcc terminal 106 may be coupled with one or more internal power rails of the NVM device 100, not shown for clarity, including a power rail of the NVM storage 104.

In various embodiments, the memory controller 102 may include a voltage level detector 108 that may be coupled with the Vcc terminal 106 to detect a level of voltage supplied to the NVM device 100. In some embodiments, the memory controller 102 may include a main controller 110 to begin direction of a voltage discharge of the NVM storage 104, a sequencer 112 to continue direction of the voltage discharge of the NVM storage 104, and an oscillator 114 that may generate a clock signal for the main controller 110, the sequencer 112, and/or other components of the NVM device 100. In various embodiments, the memory controller 102 may include additional devices, circuits, and/or components commonly found in a memory controller of a NVM device such as a NAND flash memory package.

In some embodiments, the NVM device 100 may include one or more input/output terminals 116 and one or more command terminals 118. In various embodiments, the NVM device 100 may be coupled with a processor 120. In some embodiments, the processor 120 may be a component of a storage device (e.g., a solid state drive) that includes the NVM device 100, a component of a host device (e.g., a computing device such as a server, a laptop, or a mobile computing device such as a smartphone), or any other suitable device. In various embodiments, the processor 120 may issue one or more commands via the one or more command terminals 118 and may transfer data to and/or from the NVM device 100 as input/output via the one or more input/output terminals 116.

In various embodiments, the voltage level detector 108 may monitor a voltage level of a power rail coupled with the Vcc terminal 106, and may generate an indicator in response to the voltage level is determined to be below a predetermined threshold. In some embodiments, the main controller 110 may begin a power down of the NVM storage 104 in response to the indicator from the voltage level detector 108, during a first time period, while operating within a first voltage range. The sequencer 112 may continue the power down of the NVM storage 104, during a second time period, while operating within a second voltage range lower than the first voltage range. In some embodiments, the sequencer 112 may be triggered to continue the power down of the NVM storage 104 by the main controller 110. In other embodiments, the sequencer 112 may be triggered to continue the power down of the NVM storage 104 by the voltage level detector 108. In some embodiments, the sequencer 112 may include a state machine 122 that may direct the NVM storage 104 to discharge voltage in a particular sequence. In various embodiments, the voltage level at the Vcc terminal 106 may fall below the predetermined threshold during a power-down (PD) event (e.g., when a device that includes the processor 120 shuts down) or during a power-loss (PL) event (e.g., during an unexpected power failure or unexpected disconnection of the NVM device 100 from a power source).

In various embodiments, the NVM storage 104 may be included on a semiconductor die, which may also be referred to as a semiconductor chip in some embodiments. In various embodiments, one or more components (e.g., main controller 110, sequencer 112, voltage level detector 108, and/or oscillator 114) of the memory controller 102 may be included on the same semiconductor die as the NVM storage 104. In some embodiments, one or more components of the memory controller 102 may be included on a different semiconductor die than the NVM storage 104, but may be included in the same semiconductor package, not shown for clarity, as the NVM storage 104. In some embodiments, the NVM storage 104 may be included on multiple semiconductor dies, and one or more components of the memory controller 102 may be included on one or more of the multiple semiconductor dies, or on a separate semiconductor die in the same semiconductor package as the NVM storage 104. In various embodiments, the NVM storage 104 may include a plurality of NAND memory dies. The NVM storage 104 may include any suitable number of dies and may include dual die packages (DDPs), quad die packages (QDPs), octal die packages (ODPs), and/or packages with a different number of dies such as 16 die packages (hexadecimal die packages (HDPs)) or 32 die packages (DPs).

The NVM storage 104 may be a NAND based flash memory in various embodiments. However, it should be understood that other types of NVM storage that use a predetermined voltage discharge sequence in response to a power-loss/power-down (PL/PD) event may be included instead of or in addition to NAND based flash memory in some embodiments, where a PL/PD event refers to a PL event or a PD event. In some embodiments, the NVM storage 104 may be a block-based memory. The NVM storage 104 may be embodied as NAND flash memory, NOR flash memory, phase change memory (PCM), electrically erasable programmable read-only memory (EEPROM), resistive memory, nanowire memory, three-dimensional cross point memory arrays, ferro-electric transistor random access memory (FeTRAM), magnetoresistive random access memory (MRAIVI), spin transfer torque MRAIVI, and/or any other suitable non-volatile memory that may use a predetermined voltage discharge sequence in response to a PL/PD event.

An environment may be established by the NVM device 100, in accordance with various embodiments. In some embodiments, the environment may include one or modules. Each of the modules and/or other components of the environment may be embodied as firmware, software, hardware, or a combination thereof. In some embodiments, the various modules, logic, and other components of the environment may form a portion of, or otherwise be established by, the memory controller 102 or other hardware components of the data storage device 100. As such, in some embodiments, any one or more of the modules of the environment may be embodied as a circuit or collection of electrical devices.

Figure 2:
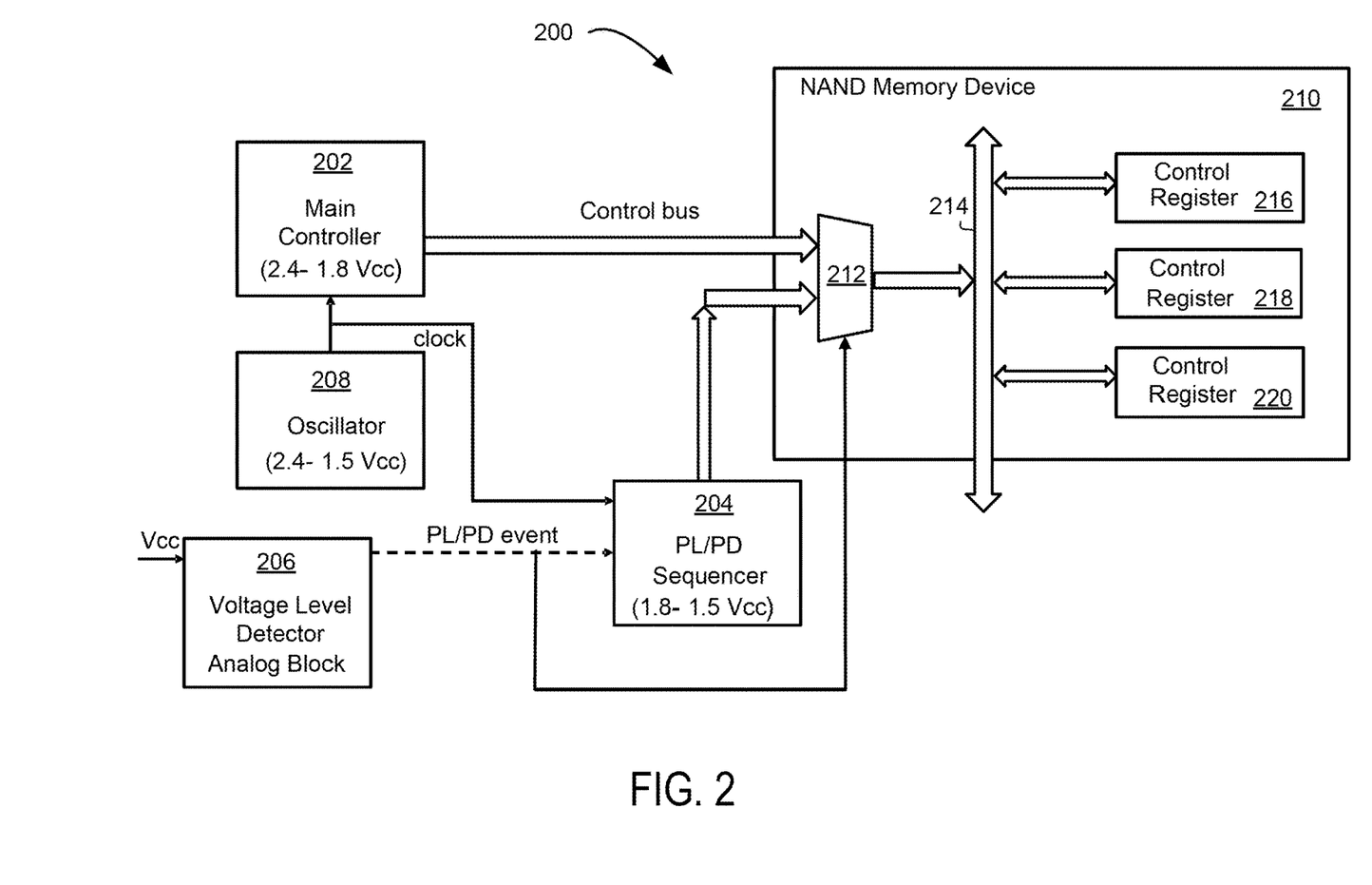
FIG. 2 is a block diagram of a NVM device that may be an implementation of the NVM device of FIG. 1, in accordance with various embodiments.

FIG. 2 is a block diagram of a NVM device 200 that may be an implementation of the NVM device 100 of FIG. 1, in accordance with some embodiments. In embodiments, the NVM device 200 may include a main controller 202, a PL/PD sequencer 204, a voltage level detector 206, and an oscillator 208 that may correspond to the main controller 110, the sequencer 112, the voltage level detector 108, and the oscillator 114 of FIG. 1, respectively. In various embodiments, the voltage level detector 206 may be an analog circuit in an analog block of a system-on-a-chip (SoC). In some embodiments, during a voltage discharge procedure, the main controller 202 may function in a first Vcc voltage range from 2.4 to 1.8 volts (V), the PL/PD sequencer 204 may function in a second Vcc voltage range from 1.8 to 1.5 V, and the oscillator 208 may function in a Vcc voltage range that spans both the first Vcc voltage range and the second Vcc voltage range, from 2.4 to 1.5 V. It should be understood that the voltage ranges with respect to the main controller 202, the PL/PD sequencer 204, and the oscillator 208 are for purposes of illustration, and may be any suitable voltage range in various embodiments. In various embodiments, a lower bound of the voltage range for the PL/PD sequencer 204 may be below a lower bound of the voltage range for the main controller 202, which may increase a useful working time window for voltage discharge operations, may allow a faster Vcc voltage ramp following a PL/PD event, and may provide advantages over integrating such low voltage operation into the main controller 202 itself by using less chip area, having higher performance, and/or using less power than such integrated approaches.

In some embodiments, the NVM device 200 may include a NAND memory device 210 that may correspond to the NVM storage 104 of FIG. 1. In various embodiments, the NVM device 200 may include a multiplexer 212 that may have a first input terminal to receive signals from the main controller 202 over a control bus, a second input terminal to receive signals from the PL/PD sequencer 204, and an output terminal may selectively couple one of the first input terminal or the second input terminal to a NVM bus 214 in response to a signal received at a select terminal of the multiplexer 212. In some embodiments, the NAND memory device 210 may include one or more control registers coupled with the NVM bus 214, such as a first control register 216, a second control register 218, and a third control register 220. Although the multiplexer 212 is shown to be a part of the NAND memory device 210, it may be outside the NAND memory device 210 in other embodiments. In various embodiments, the NAND memory device 210 may include one or more memory arrays, not shown for clarity.

In the embodiment shown, the voltage level detector 206 may generate a PL/PD event signal in response to the voltage level detector 206 detecting a voltage level to be below a predefined threshold (e.g., Vcc goes below 2.1 V). In some embodiments, the PL/PD event signal may be sent to the PL/PD sequencer 204 to begin direction of a voltage discharge sequence. In some embodiments, the PL/PD event signal may also be sent to the select terminal of the multiplexer 212 to couple the second input terminal of the multiplexer 212 to the output terminal of the multiplexer 212, such that the PL/PD sequencer 204 directs the voltage discharge operations of the NAND memory device 210.

Figure 3:
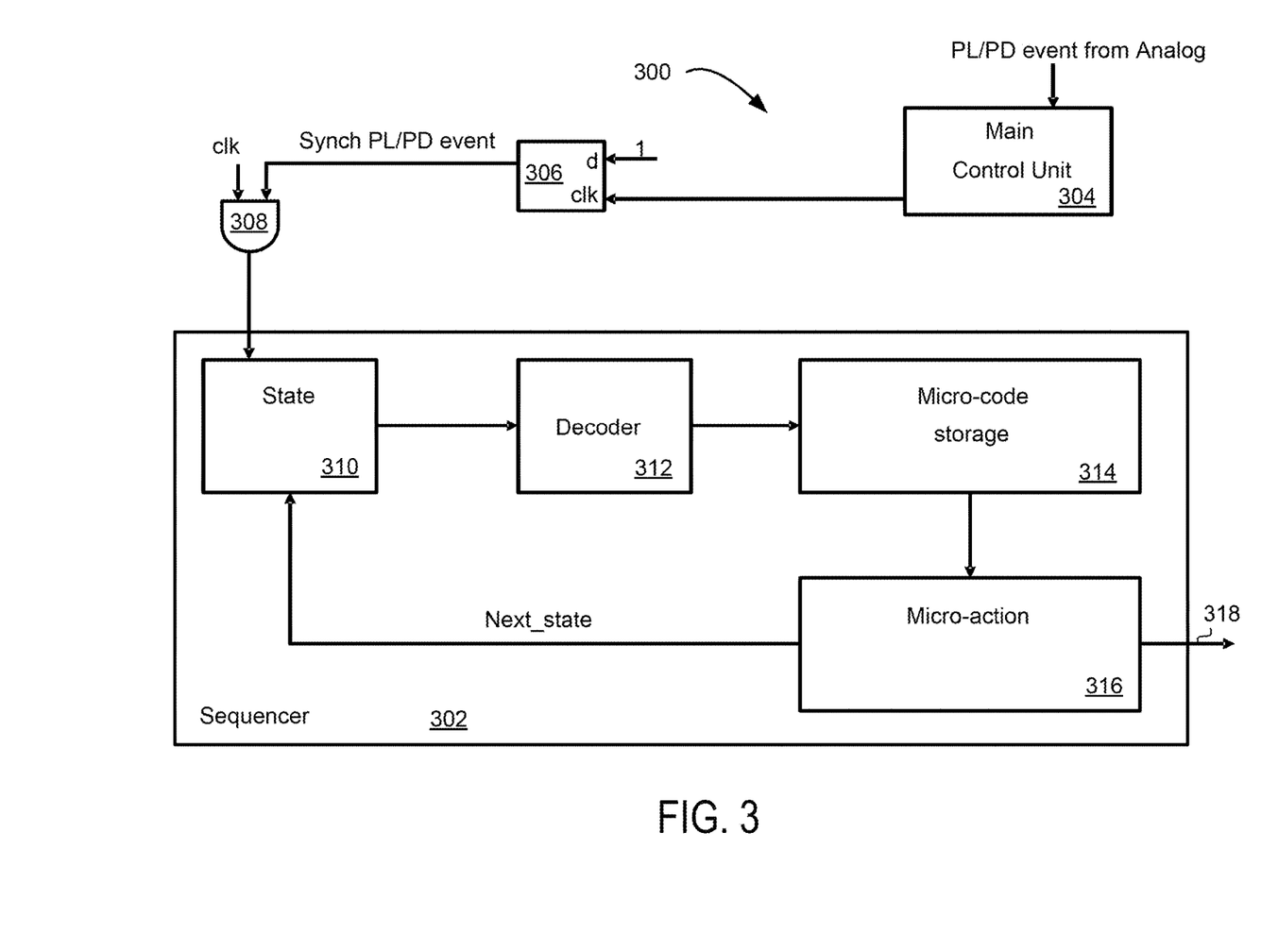
FIG. 3 depicts a block diagram of a portion of a memory controller that shows additional detail for a sequencer, in accordance with various embodiments.

In other embodiments, the PL/PD event signal from the voltage level detector 206 may be sent to the main controller 202 (e.g., to trigger an interrupt) instead of, or in addition to, the PL/PD sequencer 204. In such embodiments, the main controller 202 may begin direction of the voltage discharge operations of the NAND memory device 210, and may transfer control to the PL/PD sequencer 204 (e.g., with a signal as shown in FIG. 3), and/or may provide a select signal to the select terminal of the multiplexer 212 instead of the voltage level detector 206 providing the select signal. In various embodiments, the PL/PD sequencer 204 may function at lower levels of voltage than the main controller 202 is capable of functioning, but may be triggered only in the case of a PL/PD event.

Although the NVM device 200 is described with respect to the NAND memory device 210, it should be understood that other types of NVM devices that use a predetermined voltage discharge sequence in response to a PL/PD event may be included instead of or in addition to the NAND memory device 210 in some embodiments.

FIG. 3 is a block diagram of a portion of a memory controller 300 that shows additional detail for a sequencer 302 in accordance with some embodiments. The sequencer 302 may correspond to the sequencer 112 or the sequencer 204 in some embodiments. In various embodiments, the sequencer 302 may begin operation in response to a signal from a main control unit 304 (e.g., main controller 102 or 202). The signal from the main control unit 304 may be generated in response to an indication of a PL/PD event from an analog voltage level detector (e.g., from voltage level detector 108 or voltage level detector 206). The signal from the main control unit 304 may be generated at a control register output, not shown for clarity, of the main control unit 304. In various embodiments, a register 306 may include a first input terminal to receive the signal from the main control unit 304 and an output terminal to output a synchronize (Synch) PL/PD event signal in response to the signal from the main control unit 304. In various embodiments, a 'd' input terminal of the register 306 may receive and/or be tied to a voltage that indicates a '1' input value. In some embodiments, an AND logic gate 308 may receive the Synch PL/PD event signal at a first input terminal, a clock signal (e.g., from oscillator 114 or oscillator 208) at a second input terminal, and output a signal at an output terminal based on a logical AND operation of the signals received at the first and second input terminals. In various embodiments, the signal from the output terminal of the AND logic gate 308 may be coupled with the sequencer 302, which may begin operation in response to the signal from the AND logic gate 308.

In some embodiments, the sequencer 302 may include a state machine (e.g., state machine 122) that may include a current state block 310, a decoder 312, a micro-code storage 314, and a micro-action block 316. Based on a current state from the current state block 310, the decoder 312 may direct the state machine to a particular section of micro-code stored in the micro-code storage 314. In various embodiments, the micro-code storage 314 may be based on a metal layer storage, a read only memory (ROM), a static random access memory (SRAM), a plurality of latches, a hardwired logic configuration, or any other suitable technique. In some embodiments, the micro-code storage 314 may be based on a cascode voltage switch logic (CVSL) ROM. In various embodiments, the micro-code in the micro-code storage 314 may specify one or more micro-actions. The micro-actions specified by the micro-code may include one or more of a write register action, a wait delay action, a jump-on-condition action, or any other suitable micro-action. In some embodiments, one or more of the micro-actions may include a register address and register data to be written to a set of registers (e.g., control registers 216, 218, and/or 220) coupled with a bus (e.g., NVM bus 214). In some embodiments, the micro-actions may direct a discharge of voltage from a node (not shown for clarity) by activating a switch (not shown for clarity), to couple the node to ground. In various embodiments, the micro-actions may activate the switch via one or more registers in the set of registers. In some embodiments, the switch may be activated again by one or more micro-actions to remove the coupling of the node with ground after a predetermined delay time and/or the switch may be activated to couple a different node with ground to discharge voltage from the different node. In various embodiments, one or more micro-actions specified by the micro-code may be performed at the micro-action block 316, where a micro-action command may be presented at an output terminal 318. In some embodiments, the output terminal 318 may be coupled with a NVM storage such as the NAND memory device 210 (e.g., via the second input terminal of the multiplexer 212). Following the micro-action block 316, the state machine may proceed to a next state, which is to be stored as a next current state at the current state block 310.

Figure 4:
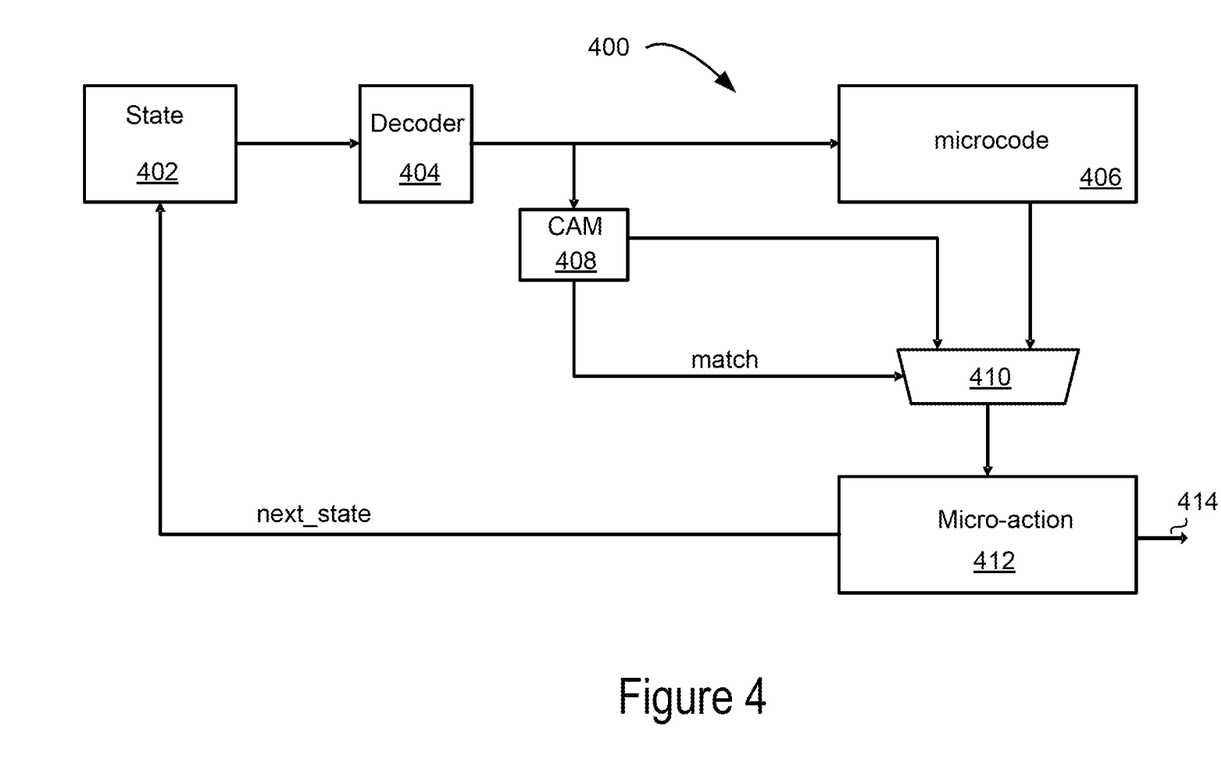
FIG. 4 depicts a block diagram of a sequencer, in accordance with various embodiments.

FIG. 4 is a block diagram of a sequencer 400, in accordance with some embodiments. In some embodiments, the sequencer 400 may include a state machine (e.g., state machine 122) that may include a current state block 402, a decoder 404, a micro-code storage 406, a content addressable memory (CAM), a multiplexer 410, and a micro-action block 412. Based on a current state from the current state block 402, the decoder 404 may direct the state machine to a particular section of micro-code stored in the micro-code storage 406. In some embodiments, the micro-code storage 406 may be based on a metal layer storage, a ROM, an SRAM, a plurality of latches, a hardwired logic configuration, or any other suitable technique. In some embodiments, the micro-code storage 406 may be based on a CVSL ROM. In some embodiments, the micro-code storage 406 may be specified with register transfer logic (RTL). In various embodiments, the micro-code stored in the micro-code storage 406 may specify one or more micro-actions. The micro-actions specified by the micro-code may include one or more of a write register action, a wait delay action, a jump-on-condition action, or any other suitable micro-action. In various embodiments, the sequencer 400 may be triggered to begin or continue operation of the state machine by a main controller (e.g., main controller 304) or by a voltage level detector.

In various embodiments, an output of the decoder 404 may be coupled with both the micro-code storage 406 and the CAM 408. The CAM 408 may be based on metal layer storage, a plurality of latches, or any other suitable technique. In some embodiments, the multiplexer 410 may include a first input terminal coupled with an output terminal of the CAM 408, a second input terminal coupled with an output terminal of the micro-code block 406, an output terminal, and a select terminal. In various embodiments, the CAM 408 may generate a match signal based on whether an address from the decoder 404 is determined to have a match in the CAM 408. In some embodiments, the match signal may be received by the select terminal of the multiplexer 410 such that the output of the CAM 408 or the output of the microcode storage 406 is selectively coupled with the output terminal of the multiplexer 410 in response to the match signal. If a match is found in the CAM 408, the match signal may cause the select terminal of the multiplexer 410 to couple the output of the CAM 408 to the output terminal of the multiplexer 410, and if a match is not found in the CAM 408, the match signal may cause the select terminal of the multiplexer 410 to couple the output of the microcode storage 406 to the output terminal of the multiplexer 410.

In various embodiments, the output terminal of the multiplexer 410 may be coupled with a micro-action block 412, where a micro-action command may be presented at an output terminal 414. In some embodiments, the output terminal 414 of the micro-action block 412 may be coupled with a NVM storage such as the NAND memory device 210 (e.g., via the second input terminal of the multiplexer 212). Following the micro-action block 412, the state machine may proceed to a next state, which may be stored as a next current state at the current state block 402.

Figure 5:
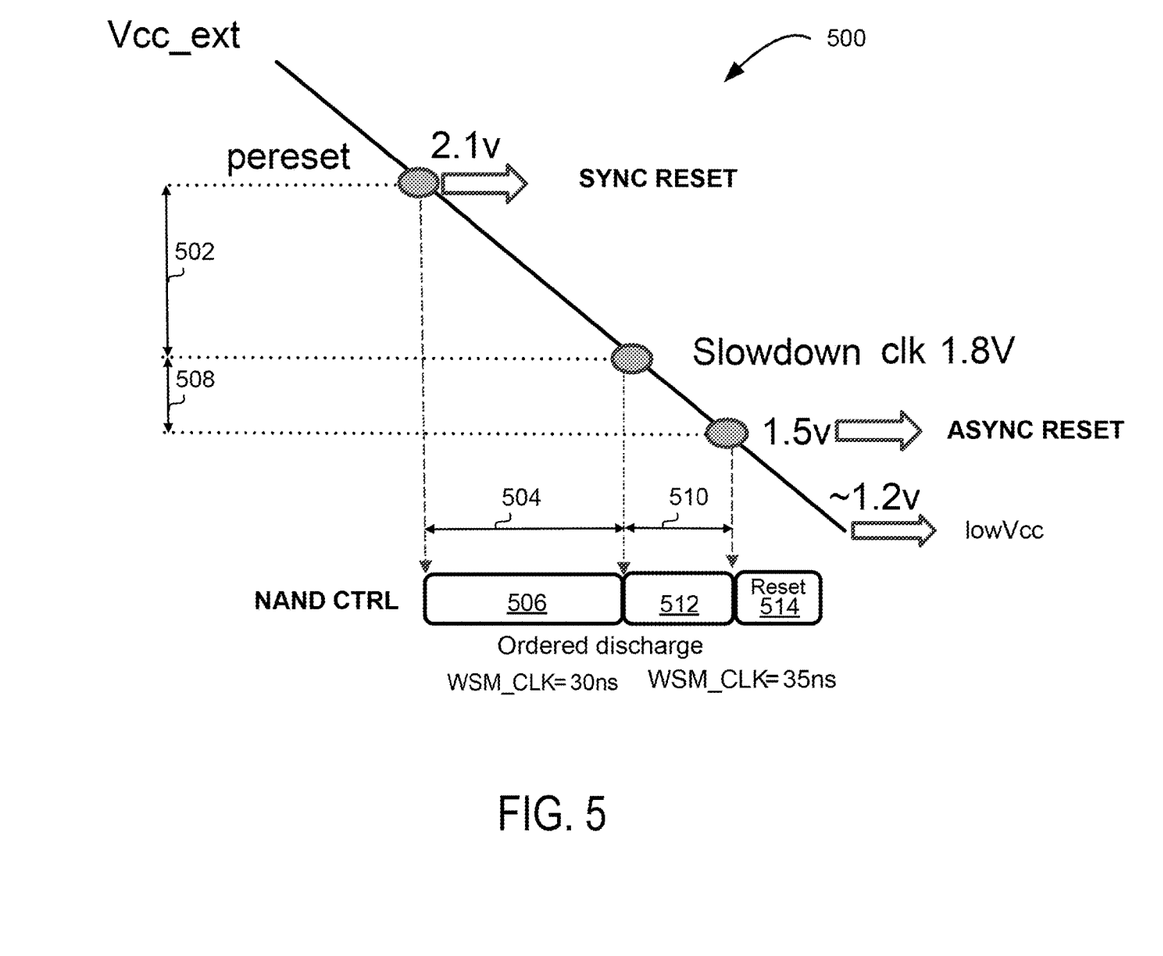
FIG. 5 is a diagram showing a voltage slope during a power-loss/power-down event and associated operations, in accordance with various embodiments.

FIG. 5 is a diagram showing a voltage slope 500 during a power-loss/power-down event and associated operations, in accordance with some embodiments. The voltage slope 500 shows a decreasing voltage such as may occur during a power-loss/power-down event, indicated as Vcc_ext (e.g., that may correspond to a voltage received at the Vcc terminal 106). In some embodiments, in a first voltage range 502 during a first time period 504, a voltage discharge procedure for a NVM storage (e.g., NAND memory device 210) may be controlled by a main controller 506 (e.g., main controller 110, 202, or 304). In various embodiments, the voltage discharge procedure in the first voltage range 502 may be triggered by a voltage level detector (e.g., voltage level detector 108 or 206) detecting Vcc_ext falling below a predetermined level (e.g., 2.1V) and generating an indicator that triggers an interrupt of the main controller 506. In some embodiments, the voltage discharge procedure may be continued in a second voltage range 508 during a second time period 510 by a sequencer 512 (e.g., sequencer 112, 204, 302, or 400). In some embodiments, the sequencer 512 may be triggered to continue the voltage discharge procedure by the main controller 506 in a similar manner to that described with respect to the sequencer 302 of FIG. 3. In various embodiments, at an end of the second time period 510, a reset 514 of the NVM storage may be performed. In some embodiments, the reset 514 may be performed before Vcc_ext falls to approximately 1.2 V, which may be designated as lowVcc in some embodiments.

In some embodiments, a program erase reset command (pereset) may be issued to the NVM storage at a voltage level of approximately 2.1 V, which may be a synchronous (SYNC) reset. In embodiments, the conclusion of operations by the sequencer 512 may be an asynchronous (ASYNC) reset, which may occur at a voltage level of approximately 1.5 V in some embodiments. In various embodiments, the discharge operations directed by the main controller 506 and the sequencer 512 may be referred to as ordered discharge operations to indicate that the voltage of the NVM storage is performed in a particular order. In some embodiments, the main controller 506 and the sequencer 512 may issue NAND control (CTRL) commands to the NVM storage to direct the discharge operations, and/or the reset operation at the block 514 may be directed with a NAND CTRL command, shown as NAND CTRL in FIG. 5. In various embodiments, a clock signal (e.g., as may be generated by oscillator 114 or 208) may have a period, identified as WSM_CLK in FIG. 5, that changes as Vcc_ext decreases. In some embodiments, the clock signal may have a period of 30 nanoseconds (ns), during the first time period 504, and a period of 35 ns during the second time period 510. In some embodiments, the transition may occur at approximately 1.8 V, designated with a label of slowdown clk in FIG. 5. In other embodiments, the clock signal may have a period that continuously decreases as a function of Vcc_ext rather than having a first period during the first time period 504, a second period during the second time period 510, and a transition between the first and second periods at approximately 1.8 V. In some embodiments, the sequencer 512 may continue to operate with a supply voltage (e.g., Vcc_ext) in a range that is too low for the main controller 506 to function properly.

Figure 6:
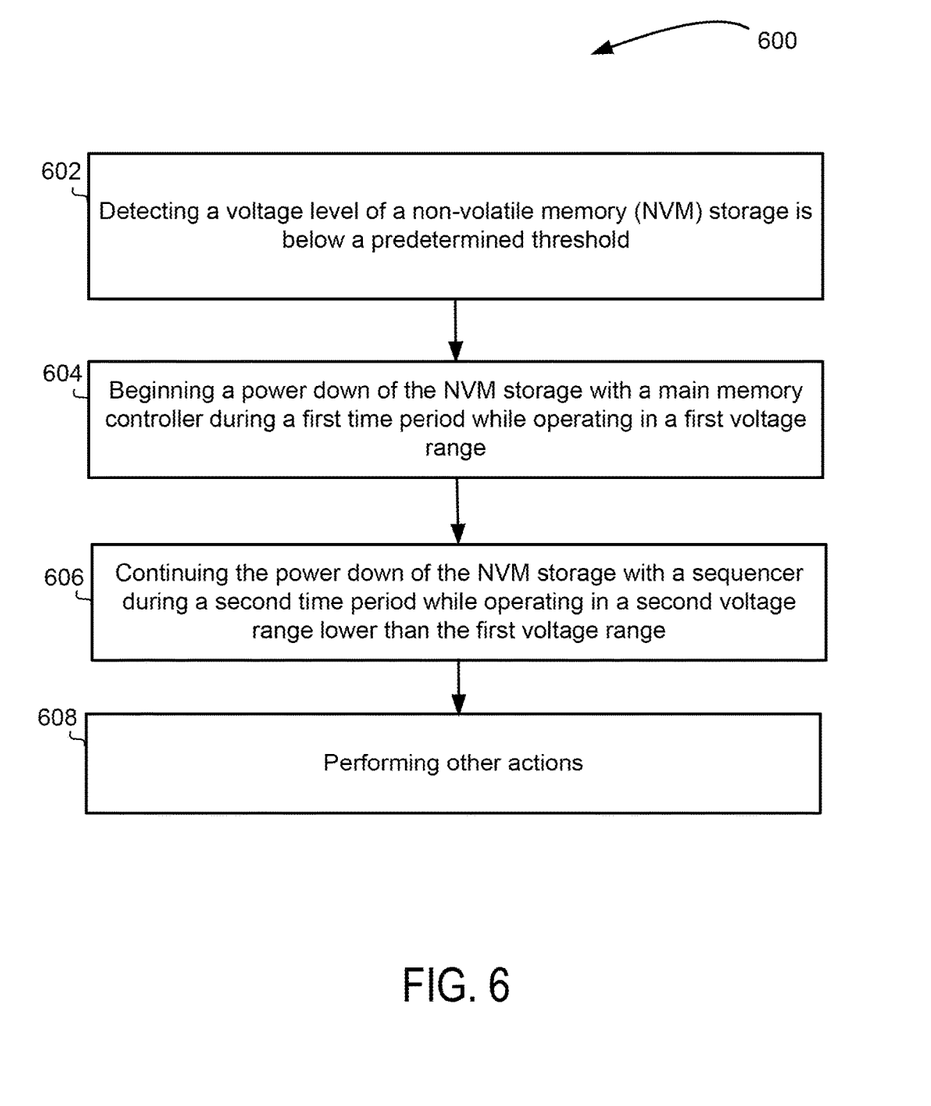
FIG. 6 is a flow diagram of a technique for discharging voltage from a NVM storage in response to a power-loss or power-down event, in accordance with various embodiments.

FIG. 6 is a flow diagram of a technique 600 for discharging voltage from a NVM storage in response to a power-loss or power-down event, in accordance with various embodiments. In some embodiments, some or all of the technique 600 may be practiced by components shown and/or described with respect to the NVM device 100 of FIG. 1, the NVM device 200 of FIG. 2, the memory controller 300, including the sequencer 302 of FIG. 3, the sequencer 400 of FIG. 4, or some other component described with respect to FIGS. 1-5.

In some embodiments, at a block 602, the technique 600 may include detecting a voltage level of a non-volatile memory (NVM) storage (e.g., NVM storage 104) is below a predetermined threshold (e.g., with voltage level detector 108 or 206). In various embodiments, at a block 604, the technique 600 may include beginning a power down of the NVM storage with a main memory controller (e.g., main controller 110, 202, 304, or 506) during a first time period (e.g., time period 504) while operating in a first voltage range (e.g., voltage range 502). In some embodiments, at a block 606, the technique 600 may include continuing the power down of the NVM storage with a sequencer (e.g., sequencer 112, 204, 302, 400, or 512) during a second time period (e.g., time period 510) while operating in a second voltage range (e.g., voltage range 508) lower than the first voltage range. In various embodiments, at a block 608, the technique 600 may include performing one or more other actions. In embodiments, beginning the power down of the NVM storage and/or continuing the power down of the NVM storage at the block 604 and/or 606 may include directing the NVM storage to perform one or more voltage discharge operations in a particular sequence that may be specified with one or more micro-action commands.

Figure 7:
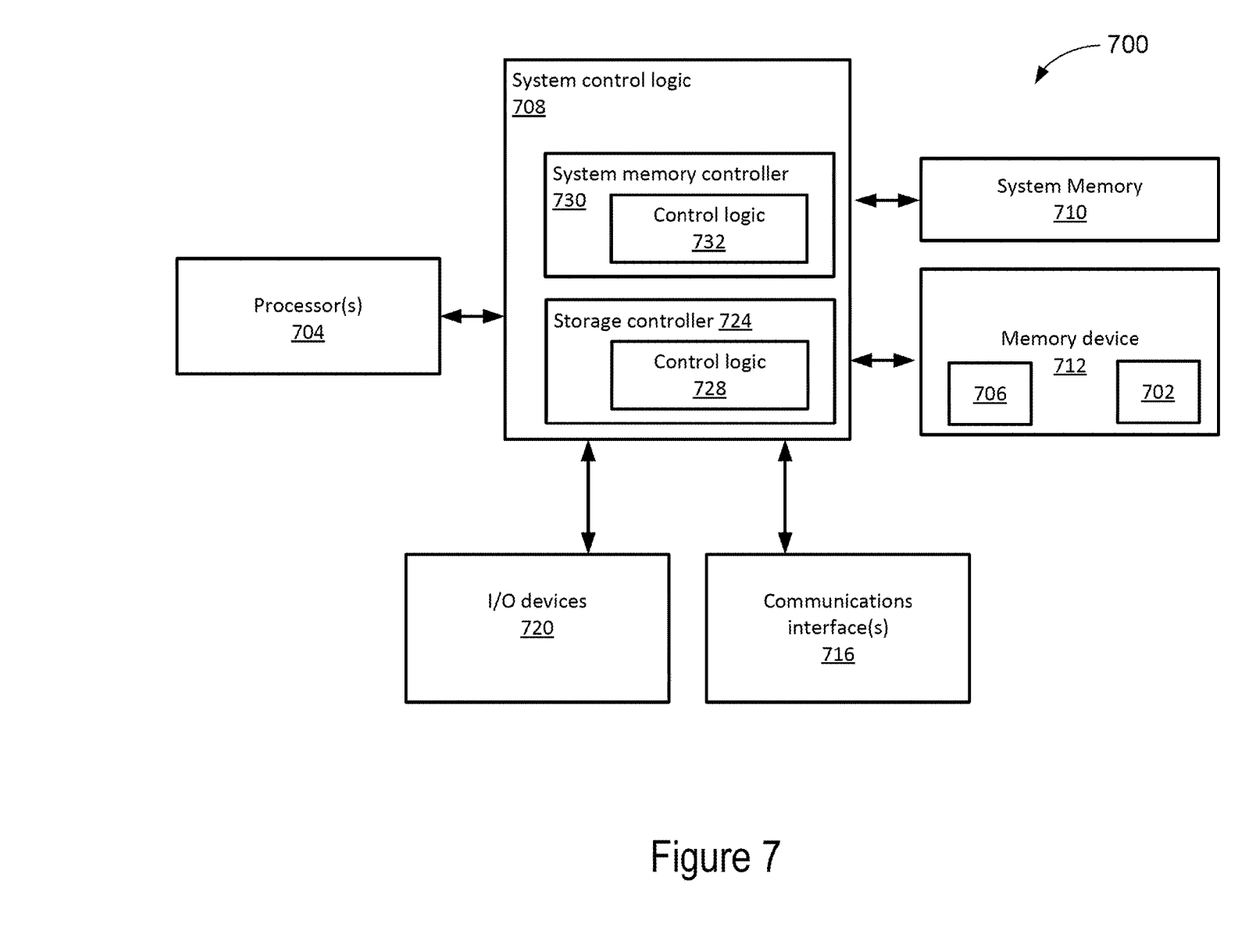
FIG. 7 schematically illustrates an example computing device that includes a NVM device as described herein, in accordance with various embodiments.

FIG. 7 schematically illustrates an example computing device 700, including a NVM device having voltage discharge capability of the present disclosure, in accordance with some embodiments. In embodiments, the computing device 700 may include system control logic 708 coupled to one or more processors or processor cores 704; system memory 710; a memory device 712 (e.g., NVM device 100 or 200) having a memory array 702 (e.g., included in NAND memory device 210) and a memory controller 706 (e.g., memory controller 102); one or more communications interface(s) 716; and input/output (I/O) devices 720. For purposes of this application, including the claims, the terms "processor" and "processor cores" may be considered synonymous, unless the context clearly requires otherwise. The processor 704 may include any type of processors, such as a central processing unit (CPU), a microprocessor, and the like. The processor 704 may be implemented as an integrated circuit having multi-cores, e.g., a multi-core microprocessor. In some embodiments, processor 704, in addition to processor cores, may further include hardware accelerators, e.g., hardware accelerators implemented with Field Programmable Gate Arrays (FPGA). In some embodiments, the system memory 710 may be volatile memory (e.g., dynamic random access memory (DRAM)), or any other suitable type of system memory.

In some embodiments, the memory device 712 may be a non-volatile computer storage chip that may include the NVM device 100 or 200 with a main controller (e.g., main controller 110, 202, 304, or 506), a sequencer (e.g., sequencer 112, 204, 302, 400, or 512), voltage level detector (e.g., voltage level detector 108 or 206), and an oscillator (e.g., oscillator 114 or 208), as described herein. In addition to the memory array 702 and the memory controller 706, the memory device 712 may include a package, having the NVM device 100 or 200 disposed therein, driver circuitry (e.g., drivers), and/or one or more power, control or input/output connections to electrically couple the memory device 712 with other components of the computing device 700, etc. In various embodiments, the memory device 712 may be configured to be removably or permanently coupled with the computing device 700.

Communications interface(s) 716 may provide an interface for computing device 700 to communicate over one or more network(s) and/or with any other suitable device. Communications interface(s) 716 may include any suitable hardware and/or firmware. Communications interface(s) 716 in various embodiments may include, for example, a network adapter, a wireless network adapter, a telephone modem, and/or a wireless modem. For wireless communications, communications interface(s) 716, in some embodiments, may use one or more antennas to communicatively couple the computing device 700 with a wireless network.

In some embodiments, at least one of the processor(s) 704 may be packaged together with logic for one or more controller(s) of system control logic 708. For one embodiment, at least one of the processor(s) 704 may be packaged together with logic for one or more controllers of system control logic 708 to form a System in Package (SiP). For one embodiment, at least one of the processor(s) 704 may be integrated on the same die with logic for one or more controller(s) of system control logic 708. For one embodiment, at least one of the processor(s) 704 may be integrated on the same die with logic for one or more controller(s) of system control logic 708 to form a System on Chip (SoC).

In some embodiments, system control logic 708 may include any suitable interface controllers to provide for any suitable interface to at least one of the processor(s) 704 and/or to any suitable device or component in communication with system control logic 708. The system control logic 708 may move data into and/or out of the various components of the computing device 700.

In some embodiments, system control logic 708 may include a storage controller 724 to provide an interface to the memory device 712 to control various storage access operations. Storage controller 724 may include control logic 728 that may be specifically configured to control access to and/or from the memory device 712. In some embodiments, the storage controller 724 or the processor 704 may correspond to the processor 120 of FIG. 1. In some embodiments, system control logic 708 may include a system memory controller 730 to control various system memory 710 access operations. System memory controller 730 may include control logic 732 that may be specifically configured to control access to and/or from the system memory 710.

In various embodiments, the I/O devices 720 may include user interfaces designed to enable user interaction with the computing device 100, peripheral component interfaces designed to enable peripheral component interaction with the computing device 700, and/or sensors designed to determine environmental conditions and/or location information related to the computing device 700. In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard. In various embodiments, the peripheral component interfaces may include, but are not limited to, a non-volatile memory port, an audio jack, and a power supply interface. In various embodiments, the sensors may include, but are not limited to, a gyro sensor, an accelerometer, a proximity sensor, an ambient light sensor, and a positioning unit. The positioning unit may additionally/alternatively be part of, or interact with, the communication interface(s) 716 to communicate with components of a positioning network, e.g., a global positioning system (GPS) satellite.

In various embodiments, the computing device 700 may be a mobile computing device such as, but not limited to, a laptop computing device, a tablet computing device, a netbook, a smartphone, etc.; a desktop computing device; a workstation; a server; etc. The computing device 700 may have more or less components, and/or different architectures. In further implementations, the computing device 700 may be any other electronic device that processes data.

Machine-readable media (including non-transitory machine-readable media, such as machine-readable storage media), methods, systems and devices for performing the above-described techniques may be used for illustrative examples of embodiments disclosed herein. Additionally, other devices in the above-described interactions may be configured to perform various disclosed techniques.

EXAMPLES

Example 1 may include a memory controller comprising: a main controller coupled with a non-volatile memory storage to begin a power down of the non-volatile memory storage during a first time period, while operating within a first voltage range, wherein the main controller is to begin the power down of the non-volatile memory storage in response to an indication of a voltage level being below a predetermined threshold; and a sequencer coupled with the non-volatile memory storage to continue the power down of the non-volatile memory storage during a second time period, while operating within a second voltage range lower than the first voltage range.

Example 2 may include the subject matter of Example 1, further including a voltage level detector coupled with the main controller to generate an indicator in response to a voltage level of the non-volatile memory storage drops below the predetermined threshold, wherein the indicator is the indication of the voltage level being below the predetermined threshold.

Example 3 may include the subject matter of Example 2, wherein the voltage level detector is included in an analog circuit.

Example 4 may include the subject matter of any one of Examples 1-3, wherein the main controller is to direct the sequencer to continue the power down of the non-volatile memory storage.

Example 5 may include the subject matter of any one of Examples 2-3, wherein the predetermined threshold is a first predetermined threshold, the voltage level is a first voltage level, the indicator is a first indicator, and the sequencer is to continue the power down of the non-volatile memory storage based at least in part on a second indicator from the voltage level detector that indicates a second voltage level of the non-volatile memory storage is below a second predetermined threshold lower than the first predetermined threshold.

Example 6 may include the subject matter of any one of Examples 1-5, wherein the sequencer includes a state machine to perform a discharge sequence, wherein the state machine includes a micro-action output to output a micro-action command to the non-volatile memory storage based at least in part on a current state of the state machine.

Example 7 may include the subject matter of Example 6, wherein the state machine further includes: a micro-code storage; and a word line decoder, wherein the word line decoder is to select a micro-code from the micro-code storage based at least in part on the current state of the state machine, wherein the micro-action command is based at least in part on the selected micro-code.

Example 8 may include the subject matter of Example 7, wherein the state machine further includes a content-addressable memory (CAM) coupled with the word line decoder, wherein the micro-action command is based on a command stored in the CAM in response to a match is found in the CAM, and is based on micro-code from the micro-code storage in response to a match is not found in the CAM.

Example 9 may include the subject matter of Example 8, wherein the micro-code storage is based on a metal layer storage, a read only memory (ROM), a static random access memory (SRAM), a plurality of latches, or a hardwired logic configuration.

Example 10 may include the subject matter of any one of Examples 1-9, further comprising a multiplexer having a first input coupled with the main controller, a second input coupled with the sequencer, and an output coupled with a control bus of the non-volatile memory storage, wherein the multiplexer is to selectively couple the main controller or the sequencer to the control bus in response to a select signal.

Example 11 may include the subject matter of any one of Examples 1-10, wherein the non-volatile memory storage includes NAND memory on a semiconductor die, and the main controller and the sequencer are on the semiconductor die.

Example 12 may include a non-volatile memory apparatus comprising: a non-volatile memory storage; a non-volatile memory control interface coupled with the non-volatile memory storage; a sequencer coupled with the non-volatile memory control interface; and a voltage level detector, wherein the sequencer is to direct the non-volatile memory storage to perform a voltage discharge sequence in response to the voltage level detector detects a voltage level of the non-volatile memory apparatus is below a predetermined threshold.

Example 13 may include the subject matter of Example 12, wherein the non-volatile memory storage is a NAND memory.

Example 14 may include the subject matter of any one of Examples 12-13, wherein, wherein the non-volatile memory storage is on a die and the sequencer is on the die.

Example 15 may include the subject matter of any one of Examples 12-14, further comprising a main controller to begin a power-down of the non-volatile memory storage during a first time period, while operating in a first voltage range, wherein the sequencer is to continue the power down of the non-volatile memory storage during a second time period, while operating in a second voltage range lower than the first voltage range.

Example 16 may include the subject matter of Example 15, further comprising an oscillator coupled with the main controller and the sequencer, wherein the oscillator has an operating voltage range that includes the first voltage range and the second voltage range.

Example 17 may include the subject matter of Example 15, further comprising a multiplexer having a first input coupled with the main controller, a second input coupled with the sequencer, and an output coupled with the non-volatile memory control interface, wherein the multiplexer is to selectively couple the main controller or the sequencer to the non-volatile memory control interface in response to a select signal.

Example 18 may include the subject matter of any one of Examples 12-17, wherein the sequencer includes a state machine to perform a discharge sequence, wherein the state machine includes a micro-action output to output a micro-action command to the non-volatile memory control interface based at least in part on a current state of the state machine.

Example 19 may include the subject matter of Example 18, wherein the state machine further includes: a micro-code storage; and a word line decoder, wherein the word line decoder is to select a micro-code from the micro-code storage based at least in part on the current state of the state machine, wherein the micro-action command is based at least in part on the selected micro-code.

Example 20 may include the subject matter of Example 19, wherein the micro-code storage is based on a metal layer storage, a read only memory (ROM), a static random access memory (SRAM), a plurality of latches, or a hardwired logic configuration.

Example 21 may include a method of powering down a non-volatile memory (NVM) storage comprising: detecting that a voltage level of the NVM storage is below a predetermined threshold; beginning a power down of the NVM storage with a main memory controller during a first time period while operating in a first voltage range; and continuing the power down of the NVM storage with a sequencer while operating in a second voltage range lower than the first voltage range.

Example 22 may include the subject matter of Example 21, wherein continuing the power down of the NVM device with the sequencer includes running a state machine to direct the NVM storage to perform one or more micro-actions.

Example 23 may include the subject matter of Example 22, wherein running the state machine includes: checking a content addressable memory (CAM) to determine whether an address is included in the CAM; and directing the NVM storage to perform one or more micro-actions based on a match in the CAM in response to the address is included in the CAM.

Example 24 may include the subject matter of any one of Examples 21-23, wherein continuing the power down of the NVM storage with the sequencer is in response to a signal from the main memory controller.

Example 25 may include the subject matter of Example 21, further comprising: providing a select signal from the main controller to a multiplexer, wherein the multiplexer includes a first input coupled with the main memory controller, a second input coupled with the sequencer, and an output, wherein the select signal causes the multiplexer to switch the output from being coupled with the first input to being coupled with the second input.

Example 26 may include an apparatus comprising means for performing the method of any one of Examples 21-25, or some other example herein.

Example 27 may include a computer-readable medium comprising instructions stored thereon, that in response to execution of the instructions cause an electronic device to perform the method of any one of Examples 21-25, or some other example herein.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions stored thereon that, when executed, result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

We claim:

1. A memory controller comprising:
a main controller, coupled with a non-volatile memory storage, to begin a power down of the non-volatile memory storage during a first time period, while operating within a first voltage range, wherein the main controller is to begin the power down of the non-volatile memory storage in response to an indication of a voltage level being below a predetermined threshold; and
a sequencer coupled with the non-volatile memory storage to continue the power down of the non-volatile memory storage during a second time period, while operating within a second voltage range lower than the first voltage range,
wherein the sequencer includes a state machine to perform a discharge sequence, wherein the state machine includes a micro-action output to output a micro-action command to the non-volatile memory storage based at least in part on a current state of the state machine.

2. The memory controller of claim 1, further including a voltage level detector coupled with the main controller to generate an indicator in response to a voltage level of the non-volatile memory storage drops below the predetermined threshold, wherein the indicator is the indication of the voltage level being below the predetermined threshold.

3. The memory controller of claim 2, wherein the voltage level detector is included in an analog circuit.

4. The memory controller of claim 1, wherein the main controller is to direct the sequencer to continue the power down of the non-volatile memory storage.

5. The memory controller of claim 1, wherein the predetermined threshold is a first predetermined threshold, the voltage level is a first voltage level, the indicator is a first indicator, and the sequencer is to continue the power down of the non-volatile memory storage based at least in part on a second indicator from a voltage level detector that indicates a second voltage level of the non-volatile memory storage is below a second predetermined threshold lower than the first predetermined threshold.

6. The memory controller of claim 1, wherein the state machine further includes:
a micro-code storage; and
a word line decoder, wherein the word line decoder is to select a micro-code from the micro-code storage based at least in part on the current state of the state machine, wherein the micro-action command is based at least in part on the selected micro-code.

7. The memory controller of claim 6, wherein the state machine further includes a content-addressable memory (CAM) coupled with the word line decoder, wherein the micro-action command is based on a command stored in the CAM in response to a match that is found in the CAM, and is based on micro-code from the micro-code storage in response to a match that is not found in the CAM.

8. The memory controller of claim 7, wherein the micro-code storage is based on a metal layer storage, a read only memory (ROM), a static random access memory (SRAM), a plurality of latches, or a hardwired logic configuration.

9. A memory controller comprising:
a main controller, coupled with a non-volatile memory storage, to begin a power down of the non-volatile memory storage during a first time period, while operating within a first voltage range, wherein the main controller is to begin the power down of the non-volatile memory storage in response to an indication of a voltage level being below a predetermined threshold;
a sequencer coupled with the non-volatile memory storage to continue the power down of the non-volatile memory storage during a second time period, while operating within a second voltage range lower than the first voltage range; and
a multiplexer having a first input coupled with the main controller, a second input coupled with the sequencer, and an output coupled with a control bus of the non-volatile memory storage, wherein the multiplexer is to selectively couple the main controller or the sequencer to the control bus in response to a select signal.

10. The memory controller of claim 1, wherein the non-volatile memory storage includes NAND memory on a semiconductor die, and the main controller and the sequencer are on the semiconductor die.

11. A non-volatile memory apparatus comprising:
a non-volatile memory storage;
a non-volatile memory control interface coupled with the non-volatile memory storage;
a sequencer coupled with the non-volatile memory control interface; and
a voltage level detector, wherein the sequencer is to direct the non-volatile memory storage to perform a voltage discharge sequence in response to the voltage level detector detects that a voltage level of the non-volatile memory apparatus is below a predetermined threshold, wherein the sequencer includes a state machine to perform a discharge sequence, wherein the state machine includes a micro-action output to output a micro-action command to the non-volatile memory control interface based at least in part on a current state of the state machine.

12. The non-volatile memory apparatus of claim 11, wherein the non-volatile memory storage is a NAND memory.

13. The non-volatile memory apparatus of claim 11, wherein the non-volatile memory storage is on a die and the sequencer is on the die.

14. The non-volatile memory apparatus of claim 11, further comprising a main controller to begin a power-down of the non-volatile memory storage during a first time period, while operating in a first voltage range, wherein the sequencer is to continue the power down of the non-volatile memory storage during a second time period, while operating in a second voltage range lower than the first voltage range.

15. The non-volatile memory apparatus of claim 14, further comprising an oscillator coupled with the main controller and the sequencer, wherein the oscillator has an operating voltage range that includes the first voltage range and the second voltage range.

16. The non-volatile memory apparatus of claim 14, further comprising a multiplexer having a first input coupled with the main controller, a second input coupled with the sequencer, and an output coupled with the non-volatile memory control interface, wherein the multiplexer is to selectively couple the main controller or the sequencer to the non-volatile memory control interface in response to a select signal.

17. The non-volatile memory apparatus of claim 12, wherein the state machine further includes:
a micro-code storage; and
a word line decoder, wherein the word line decoder is to select a micro-code from the micro-code storage based at least in part on the current state of the state machine, wherein the micro-action command is based at least in part on the selected micro-code.

18. The non-volatile memory apparatus of claim 17, wherein the micro-code storage is based on a metal layer storage, a read only memory (ROM), a static random access memory (SRAM), a plurality of latches, or a hardwired logic configuration.

19. A method of powering down a non-volatile memory (NVM) storage comprising:
detecting that a voltage level of the NVM storage is below a predetermined threshold;
beginning a power down of the NVM storage with a main memory controller during a first time period while operating in a first voltage range; and
continuing the power down of the NVM storage with a sequencer while operating in a second voltage range lower than the first voltage range,
wherein continuing the power down of the NVM storage with the sequencer includes running a state machine to direct the NVM storage to perform one or more micro-action.

20. The method of claim 19, wherein running the state machine includes:
checking a content addressable memory (CAM) to determine whether an address is included in the CAM; and
directing the NVM storage to perform one or more micro-actions based on a match in the CAM in response to the address is included in the CAM.

21. The method of claim 19, wherein continuing the power down of the NVM storage with the sequencer is in response to a signal from the main memory controller.

22. The method of claim 19, further comprising: providing a select signal from the main memory controller to a multiplexer, wherein the multiplexer includes a first input coupled with the main memory controller, a second input coupled with the sequencer, and an output, wherein the select signal causes the multiplexer to switch the output from being coupled with the first input to being coupled with the second input.

* * * * *